(12) United States Patent
Choi et al.

(10) Patent No.: US 7,982,228 B2
(45) Date of Patent: Jul. 19, 2011

(54) SEMICONDUCTOR COLOR-TUNABLE BROADBAND LIGHT SOURCES AND FULL-COLOR MICRODISPLAYS

(75) Inventors: Hoi Wai Choi, Hong Kong (CN); Kwun Nam Hui, Hong Kong (CN); Xianghua Wang, Hong Kong (CN)

(73) Assignee: Versitech Limited, Hong Kong (CN)

( * ) Notice: Subject to any disclaimer, the term of this patent is extended or adjusted under 35 U.S.C. 154(b) by 123 days.

(21) Appl. No.: 12/572,345

(22) Filed: Oct. 2, 2009

(65) Prior Publication Data

US 2010/0084668 A1   Apr. 8, 2010

Related U.S. Application Data

(60) Provisional application No. 61/102,760, filed on Oct. 3, 2008.

(51) Int. Cl.
*H01L 29/20* (2006.01)

(52) U.S. Cl. ...... 257/89; 438/46; 438/463; 257/E33.019; 257/E21.532; 257/103; 257/E21.09; 257/E33.023

(58) Field of Classification Search ...... 438/46, 438/463; 257/89, E33.055, E21.532, 103, 257/E21.09, E33.019, E33.023
See application file for complete search history.

(56) References Cited

U.S. PATENT DOCUMENTS

| | | | |
|---|---|---|---|
| 4,851,371 A * | 7/1989 | Fisher et al. | 438/21 |
| 5,071,248 A * | 12/1991 | Tiefenthaler et al. | 356/128 |
| 5,136,603 A * | 8/1992 | Hasnain et al. | 372/50.21 |
| 5,705,834 A * | 1/1998 | Egalon et al. | 257/95 |
| 5,739,552 A | 4/1998 | Kimura et al. | |
| 5,892,786 A * | 4/1999 | Lott | 372/50.124 |
| 5,959,643 A * | 9/1999 | Temple et al. | 347/40 |
| 6,165,815 A * | 12/2000 | Ball | 438/113 |
| 6,229,160 B1 * | 5/2001 | Krames et al. | 257/94 |
| 6,429,462 B1 * | 8/2002 | Shveykin | 257/95 |
| 6,515,309 B1 * | 2/2003 | Tohyama et al. | 257/88 |
| 6,518,543 B1 * | 2/2003 | Benz et al. | 219/121.71 |
| 6,569,604 B1 * | 5/2003 | Bhatt et al. | 430/311 |
| 6,570,190 B2 | 5/2003 | Krames et al. | |
| 6,618,414 B1 * | 9/2003 | Wasserbauer et al. | 372/45.01 |
| 6,649,938 B1 * | 11/2003 | Bogatov et al. | 257/95 |
| 6,706,546 B2 * | 3/2004 | Yoshimura et al. | 438/31 |

(Continued)

FOREIGN PATENT DOCUMENTS

WO   WO-2008/014675 A1   2/2008

*Primary Examiner* — N Drew Richards
*Assistant Examiner* — Ankush k Singal
(74) *Attorney, Agent, or Firm* — Saliwanchik, Lloyd & Eisenschenk

(57) ABSTRACT

Methods and systems are provided that may be used to utilize and manufacture a light sources apparatus. A first light emitting diode emits light having a first wavelength, and a second light emitting diode for emitting light having a second wavelength. Each of the first and second light emitting diodes may comprise angled facets to reflect incident light in a direct toward a top end of the first light emitting diode. The second light emitting diode comprising angled facets may reflect incident light in a direction toward a top end of the second light emitting diode. A first distributed Bragg reflector is disposed between the top end of the first light emitting diode and a bottom end of the second light emitting diode to allow light from the first light emitting diode to pass through and to reflect light from the second light emitting diode.

32 Claims, 12 Drawing Sheets
(6 of 12 Drawing Sheet(s) Filed in Color)

U.S. PATENT DOCUMENTS

| | | | |
|---|---|---|---|
| 6,924,163 B2 * | 8/2005 | Okazaki et al. | 438/46 |
| 6,936,864 B2 * | 8/2005 | Kondo | 257/103 |
| 6,998,642 B2 * | 2/2006 | Lin et al. | 257/79 |
| 7,008,861 B2 * | 3/2006 | Andrews et al. | 438/463 |
| 7,056,810 B2 * | 6/2006 | Yamazaki et al. | 438/458 |
| 7,169,629 B2 * | 1/2007 | Wu et al. | 438/22 |
| 7,223,998 B2 * | 5/2007 | Schwach et al. | 257/86 |
| 7,271,420 B2 | 9/2007 | Cao | |
| 7,323,723 B2 * | 1/2008 | Ohtsuka et al. | 257/98 |
| 7,324,574 B2 * | 1/2008 | Kim | 372/50.21 |
| 7,368,812 B2 * | 5/2008 | Akram | 257/686 |
| 7,387,742 B2 * | 6/2008 | Daskal et al. | 216/53 |
| 7,388,172 B2 * | 6/2008 | Sercel et al. | 219/121.72 |
| 7,431,486 B2 * | 10/2008 | Bloemen et al. | 362/540 |
| 7,579,202 B2 | 8/2009 | Hsu et al. | 438/33 |
| 7,709,768 B2 | 5/2010 | Sercel et al. | 219/121.72 |
| 7,767,480 B1 | 8/2010 | Pickrell et al. | 438/37 |
| 7,812,357 B2 | 10/2010 | Kim et al. | 257/94 |
| 7,901,989 B2 | 3/2011 | Haba et al. | 438/110 |
| 2001/0035401 A1 * | 11/2001 | Manor | 219/121.72 |
| 2002/0000428 A1 * | 1/2002 | Dulaney et al. | 219/121.69 |
| 2002/0162399 A1 * | 11/2002 | Esashi et al. | 73/715 |
| 2002/0163003 A1 * | 11/2002 | Dal Negro et al. | 257/79 |
| 2003/0075723 A1 * | 4/2003 | Heremans et al. | 257/98 |
| 2003/0091083 A1 * | 5/2003 | Hwang et al. | 372/46 |
| 2003/0169785 A1 * | 9/2003 | Kim | 372/20 |
| 2004/0012662 A1 * | 1/2004 | Kneezel et al. | 347/93 |
| 2004/0013378 A1 * | 1/2004 | Lee et al. | 385/125 |
| 2004/0026700 A1 * | 2/2004 | Akaike et al. | 257/79 |
| 2004/0096996 A1 * | 5/2004 | Cheng et al. | 438/22 |
| 2004/0227144 A1 * | 11/2004 | Hon | 257/87 |
| 2005/0067627 A1 | 3/2005 | Shen et al. | |
| 2005/0199592 A1 * | 9/2005 | Iri et al. | 219/121.6 |
| 2006/0054905 A1 * | 3/2006 | Schwach et al. | 257/89 |
| 2006/0145137 A1 * | 7/2006 | Wang et al. | 257/14 |
| 2006/0145174 A1 * | 7/2006 | Lee et al. | 257/98 |
| 2006/0220183 A1 * | 10/2006 | Asai et al. | 257/622 |
| 2007/0111477 A1 * | 5/2007 | Maruyama et al. | 438/460 |
| 2007/0114552 A1 * | 5/2007 | Jang et al. | 257/98 |
| 2007/0176546 A1 * | 8/2007 | Hsieh et al. | 313/506 |
| 2008/0023715 A1 | 1/2008 | Choi | |
| 2008/0049438 A1 * | 2/2008 | Bloemen et al. | 362/540 |
| 2008/0149945 A1 * | 6/2008 | Nagai | 257/88 |
| 2008/0279241 A1 * | 11/2008 | Oki et al. | 372/45.01 |
| 2008/0308820 A1 * | 12/2008 | Louwsma et al. | 257/89 |
| 2009/0057282 A1 | 3/2009 | Huang et al. | 219/121.71 |
| 2009/0065902 A1 | 3/2009 | Yu et al. | 257/620 |
| 2009/0121237 A1 | 5/2009 | Murofushi et al. | 257/88 |
| 2009/0321955 A1 | 12/2009 | Houle et al. | 257/777 |
| 2010/0025704 A1 | 2/2010 | Wang et al. | 257/98 |

* cited by examiner

SEMICONDUCTOR COLOR-TUNABLE BROADBAND LIGHT SOURCES AND FULL-COLOR MICRODISPLAYS

CROSS-REFERENCE TO RELATED APPLICATION

The subject application claims the benefit of U.S. Provisional Application Ser. No. 61/102,760, filed Oct. 3, 2008, which is hereby incorporated by reference in its entirety.

TECHNICAL FIELD

The present invention relates to light emitting diode (LED) devices.

BACKGROUND ART

LEDs are optoelectronic devices, which emit light by recombining injected electrons and holes radiatively. Depending on the bandgap of the active material in a particular optoelectronic device, LEDs can emit at a wide range of wavelengths from ultraviolet to infrared. However, the wavelengths of light which are of major interest are in the visible region. LEDs emitting in the visible spectrum (typically from ~400 nm (purple) to ~700 nm (red)) are visible to one's eye and are thus useful for illumination purposes. In order to emit light at visible wavelengths, the group III and V elements (i.e., elements in the third and fifth columns of the Periodic Table, respectively) which are often used are gallium (Ga), indium (In) and nitrogen (N). Such materials are often doped with impurities from other columns of the periodic table to allow electrical activity, which in turn generates light via the recombination of an electron from a conducting state to a valence state.

The devices above are referred to as being of the (In,Ga) N material group. LEDs fabricated from this material system have been utilized. LEDs typically include monochromatic light sources which emit with single spectral peak and a narrow linewidth (e.g., ~30 nm). LEDs fabricated using the (In,Ga) N material system can be made to emit monochromatic light ranging from ~380 nm (near UV) to ~540 nm (i.e., green) by changing the indium composition in the material system. LEDs, with their monochromatic nature, are useful in applications such as light indicators, where only a single color is required.

White light, on the other hand, is broadband, polychromatic light which cannot be generated directly with a single LED. However, if an LED can be made to generate light at a number of discrete or continuous wavelengths, the resultant spectrum may be polychromatic and the emission from such an LED will appear as white. This may be useful because white light is often ideal for illumination purposes. LEDs as illumination light sources may be superior to previous lighting technologies such as incandescent lamp and fluorescent tubes, in terms of luminous efficiency, lifetime and spectrum pureness.

There are two major conventional methods of making broadband LED light sources. The first method makes use of phosphors for color down conversion. Phosphorescent materials that emit light when exposed to certain wavelengths of radiation are traditionally used for color conversion in light-emitting diodes (LEDs). A device may emit a high-energy photon, and the phosphor may absorb it and then re-emit a lower-energy and thus differently colored photon.

Such phosphors absorb shorter-wavelength photons and re-emit longer wavelength photons. For white light emission, green and red light-emitting phosphors may be used. It should be observed that any form of color conversion involves energy losses. While green phosphors can have quantum efficiencies of up to 90%, quantum efficiencies of red phosphors are typically limited to around 40%. This, in turn, translates to low wall-plug efficiency.

In such color down conversion schemes, a shorter wavelength monochromatic LED, such as an InGaN LED emitting at 460 nm (blue), may be used as an excitation light source. Such light may be used to excite luminescence in phosphors emitting at longer wavelengths, such as green and red. A resultant light consists of components from different parts of the visible spectrum, and is thus considered broadband light. Since the phosphor particles are small (e.g., on a nanometer scale) and indistinguishable to the naked eye, the emitted light appears as white if the proportions of the different colors are right. This form of white light generation is similar to that employed in fluorescent tubes.

However, there are many drawbacks associated with phosphors, including limited lifetime, Stokes-wave energy loss, low reliability and low luminous efficiency.

Another method of making a broadband LED light source is to mount discrete LED chips onto a single package. These are often called multi-chip LEDs, where LEDs emitting at the primary colors of light (i.e., blue, green and red) are mounted onto a single package. However, white light emission cannot be achieved using this technique. Each LED chip is typically over 100 microns in dimension, while the separation of LED chips is of the same order. As a result, the colors are not homogenized and therefore appear as discrete colors to the naked eye unless placed at very far distances, by which time an LED's intensity has dropped immensely.

SUMMARY OF THE INVENTION

In order to overcome the shortcomings of the prior art, the present invention provides semiconductor color-tunable broadband light sources and full-color microdisplays, as well as the process of manufacturing the same.

According to the first aspect, the present invention provides a light sources apparatus, comprising: a first light emitting diode for emitting light having a first wavelength, the first light emitting diode comprising angled facets to reflect incident light in a direction toward a top end of the first light emitting diode; a second light emitting diode for emitting light having a second wavelength, the second light emitting diode being disposed above the top end of the first light emitting diode, and the second light emitting diode comprising angled facets to reflect incident light in a direction toward a top end of the second light emitting diode; and a first distributed Bragg reflector disposed between the top end of the first light emitting diode and a bottom end of the second light emitting diode to allow light from the first light emitting diode to pass through and to reflect light from the second light emitting diode.

According to the second aspect, the present invention provides an optoelectronic device comprising a stack of monochromatic microdisplays, the stack of monochromatic microdisplays comprising: a first microdisplay to emit light having a first wavelength; at least a second microdisplay to emit light having a second wavelength, the first wavelength being different from the second wavelength; and a distributed Bragg reflector disposed between the first microdisplay and the at least a second microdisplay to allow light from the first microdisplay to pass through and to reflect light from the at least a second microdisplay.

According to the third aspect, the present invention provides a wafer dicing process of electronic and optoelectronic devices based on laser micromachining to form diced chips with angled facets, the wafer dicing process comprising: providing a processed wafer with multiple fabricated devices on an upper surface; directing a laser beam at the wafer surface for wafer dicing; reflecting the laser beam off a laser mirror, wherein the laser beam is incident onto the processed wafer at an oblique angle from a vertical axis, the incident beam forming a trench at a point of incidence by removal of semiconductor, metal or insulator materials; translating the processed wafer so that the laser beam forms a trench around a periphery of devices on the processed wafer.

BRIEF DESCRIPTION OF DRAWINGS

The patent or application file contains at least one drawing executed in color. Copies of this patent or patent application publication with color drawings will be provided by the Patent Office upon request and payment of the necessary fee.

Non-limiting and non-exhaustive aspects are described with reference to the following figures, wherein like reference numerals refer to like parts throughout the various figures unless otherwise specified.

DETAILED DESCRIPTION

Figure 1:
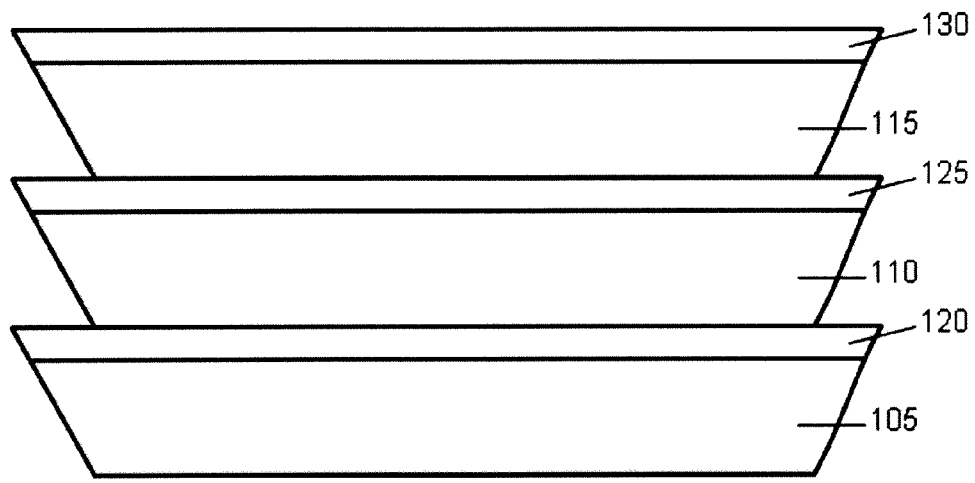
FIG. 1 illustrates an LED stack according to the present invention.

Some exemplary methods and systems are described herein that may be used to utilize and manufacture a solid-state light source comprising a light emitting diode (LED) stack. A process of manufacturing the same is also provided. Such a solid-state light source may be capable of emitting discrete primary colors of light (e.g., red, blue and green), or mixed colors including the color white. Such an LED stack may consist of a blue LED stacked onto a green LED, which may subsequently be stacked on top of a red LED. Such a stacking strategy may ensure optimal color mixing. The three LED devices may be individually controllable. If all three are illuminated, an optically-mixed output may result in white light. Monochromatic light may be obtained by turning on only a single LED device of an LED stack. Other colors may be tuned by turning on two or three LED devices simultaneously, and by adjusting appropriate bias voltages.

Discrete blue, green, red LEDs in a device can be driven individually and can vary the intensities of the various color components. However, the colors are not mixed and thus do not constitute a color tunable device. True color tunable LEDs are not available in the market to date.

In recent years semiconductor-based emissive microdisplays have been demonstrated using LED materials. However, due to the monochromatic nature of LED wafers, these microdisplays can only emit at a single color. While full color microdisplays may be implemented using a tri-color pixel, there may be several disadvantages. Such disadvantages may include (1) all the disadvantages associated with phosphors as discussed above, (2) the complexity of coating individual pixels with phosphors at the micrometer scale, and (3) the complexity of a driving circuit.

A stacked LED design, as discussed herein, does not utilize color conversion to generate white light. Each LED device in a stack may include a transparent material to allow light to pass through. By adopting the correct LED stack sequence (that is, a blue LED device on top of a green LED device, followed by a red LED device at the bottom), the emitted light may transmit through the transparent devices on top with minimal absorption loss. By virtue of the fact that the LED devices are stacked on top of each other, the photons from the three LED devices are all emitted from the same window (that is, through the top blue LED device), such that the output color is optically well-mixed. Integration of a distributed Bragg reflector (DBR) between LED devices may ensure that light is emitted in a direction toward an emission window due to the wavelength-selective reflecting nature of the dielectric mirrors.

Each of the LED devices may include micromachined angled facets with coated metal mirrors to inhibit leakage of monochromatic light from the LED facets. Such an implementation may also eliminate issues pertaining to color conversion using phosphors, including limited lifetime, Stokes-wave energy loss, low reliability and low luminous efficiency. By avoiding such disadvantages of traditional white light LED devices the full potential of LEDs can be tapped to provide high quantum efficiency, long lifetimes, and high reliability.

An implementation may also extend to full color microdisplays using a similar stacking strategy. For example, three monochromatic microdisplays may be stacked well-aligned on top of each other to realize a full-color microdisplay. A blue microdisplay may be stacked on top of a green microdisplay, which may, in turn, be subsequently stacked on top of a red microdisplay. The three microdisplays may have identical design and dimensions, so that if stacked together the individual pixels overlap each other (e.g., this may be referred to as a "pixel stack"). Therefore, each pixel may effectively comprise a device consisting of three LED devices stacked on top of each other. By controlling the intensities of the three LED devices, the output color of the pixel can be controlled. As such, a microdisplay of any pixel dimension and resolution with full color emission may be achieved.

FIG. 1 illustrates an LED stack 100 according to the present invention. Such an LED stack may be comprised of a red LED device 105, a green LED device 110, and a blue LED device 115. Red LED device 105 may emit light having a wavelength in a range around 650 nm, green LED device 110 may emit light having a wavelength un a range around 510 nm, and blue LED device 115 may emit light having a wavelength in a range around 475 nm. LED stack 100 may include a first Distributed Bragg Reflector (DBR) 120 disposed on a top edge of red LED device 105 below green LED device 110. A second DBR 125 may be disposed on a top edge of green LED device 110 below blue LED device 115. The DBR may allow light from an LED below to pass through and may also reflect light from an. LED disposed above. For example, light from green LED device 110 may pass through DBR 125 and any light reflected down through blue LED device 115 onto a top surface of DBR 125 may be reflected in a direction toward a top surface 130 of blue LED device 115.

Figure 2:
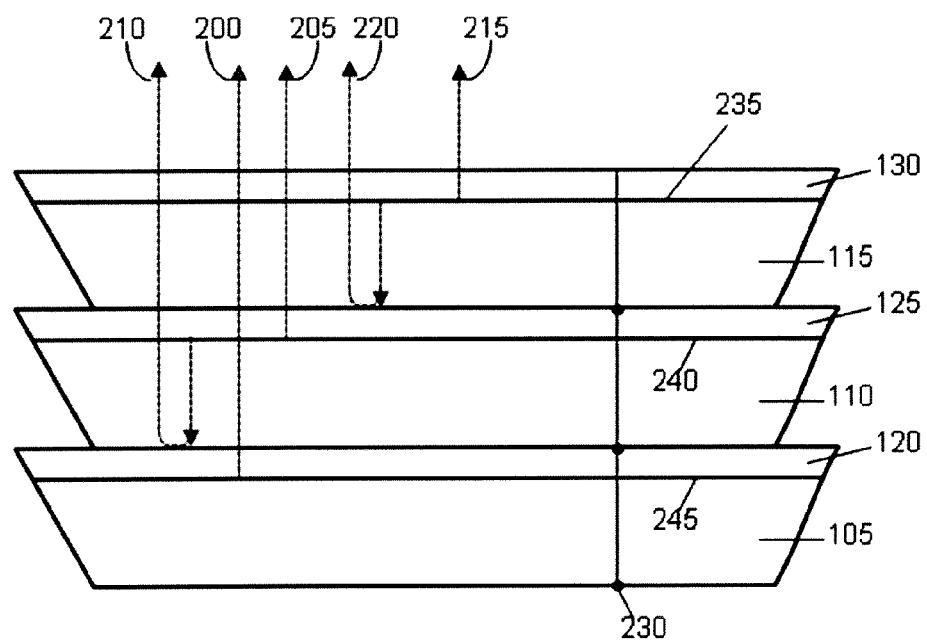
FIG. 2 illustrates some examples of different color light that may be produced by selectively powering the red LED device, green LED device, and blue LED device according to the present invention.

FIG. 2 illustrates some examples of different color light that may be produced by selectively powering the red LED device 105, green LED device 110, and blue LED device 115 according to the present invention. In this example, a red light beam 200 may be emitted by red LED 105 and may travel up through DBR 120, green LED 110, DBR 125, blue LED 115, and through the top surface 130 of blue LED device 115. Green LED device 110 may emit a green light beam 205 that travels up through DBR 125, blue LED 115, and through the top surface 130 of blue LED device 115. Green LED device may also generate a second green light beam 210 that initially travels in a direction toward DBR 120. However, DBR 120 may reflect the second green light beam 210 in a direction though DBR 125, blue LED 115, and through the top surface 130 of blue LED device 115.

Blue LED device 115 may emit a blue light beam 215 that travels up through the top surface 130 of blue LED device 115. Blue LED device 115 may also generate a second blue light beam 220 that initially travels in a direction toward DBR 125. However, DBR 125 may reflect the second blue light beam 220 in a direction though the top surface 130 of blue LED device 115.

Red LED device 105, green LED device 110, and blue LED device 115 may share a common anode 230 and may be selectively powered via their own cathodes. For example, blue LED 115 may utilize a first cathode 235, green LED device 110 may utilize a second cathode 240, and red LED device 105 may utilize a third cathode 245.

Figure 3:
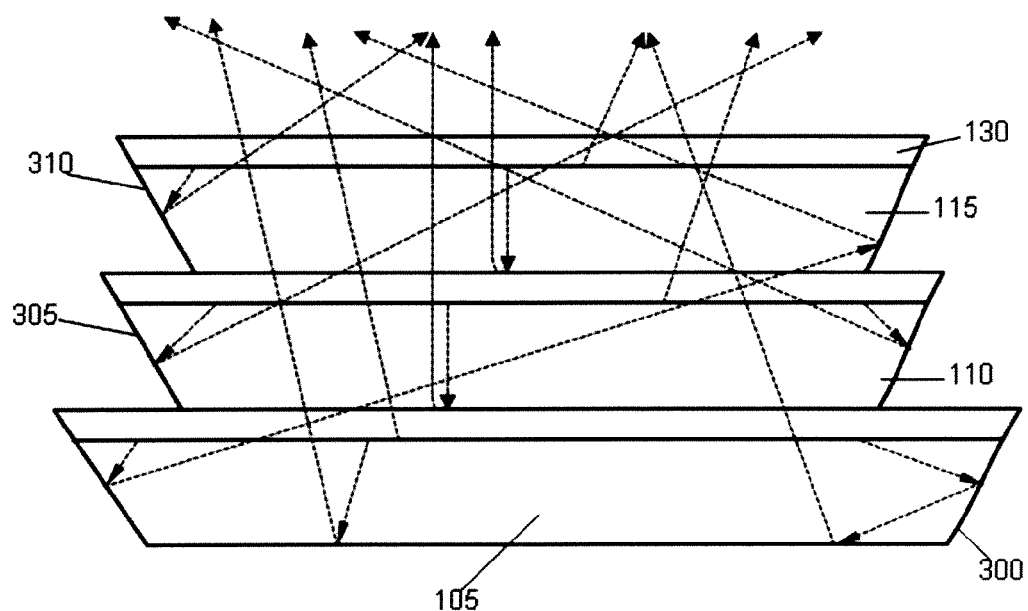
FIG. 3 illustrates various angles at which light beams may travel within the red LED device, green LED device, and blue LED device according to the present invention.

FIG. 3 illustrates various angles at which light beams may travel within the red LED device 105, green LED device 110, and blue LED device 115 according to the present invention. In this example, angled facets or walls of each of the red LED device 105, green LED device 110, and blue LED device 115 may be coated with a mirrored material to ensure that light beams to do not escape from a side of an LED device and instead are directed up through the top surface 130 of the blue LED device 115. In this example, red LED device 105 includes a first mirrored surface 300, green LED device 110 includes a second mirrored surface 305, and blue LED device 115 includes a third mirrored surface 310. Any of the mirrored surfaces may be coated with a metal such as aluminum or silver.

Figure 4:
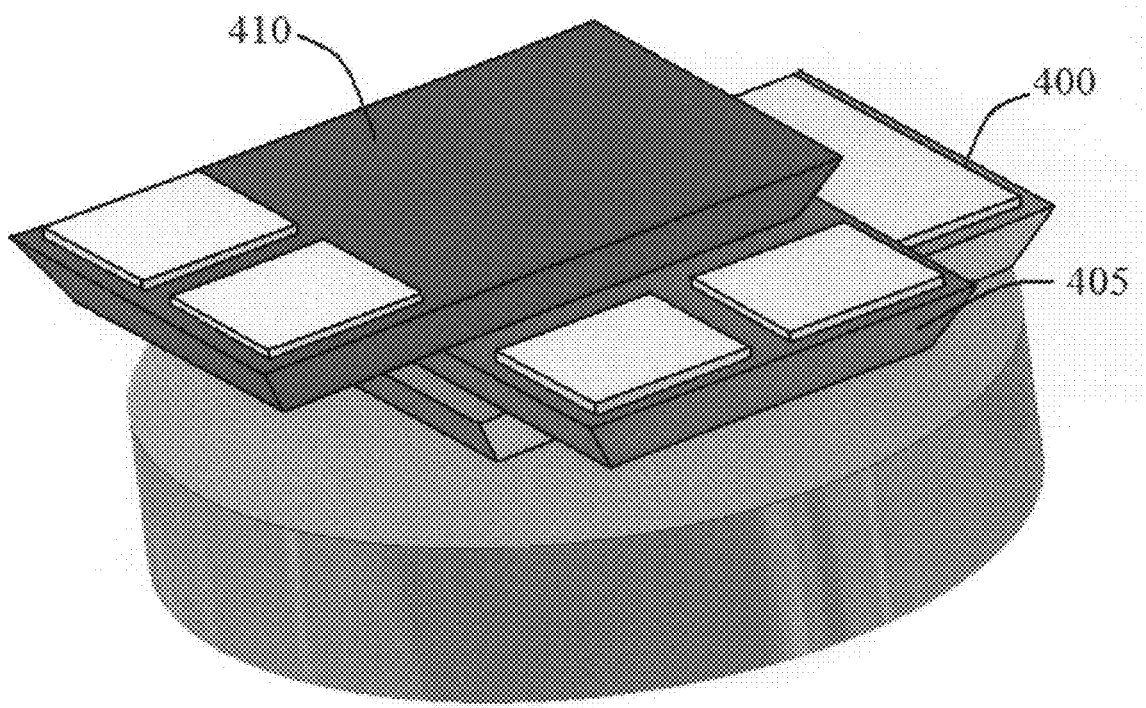
FIG. 4 illustrates a schematic diagram of a three-LED stack according to the present invention.

FIG. 4 illustrates a schematic diagram of a three-LED stack according to the present invention. As shown, a first LED device 400 is disposed beneath both a second LED device 405, and a third LED device 410. With respect to FIG. 1, first LED device 400 may correspond to red LED 105, second LED device 405 may correspond to green LED device 110, and third LED device 410 may correspond to blue LED device 115.

Figure 5:
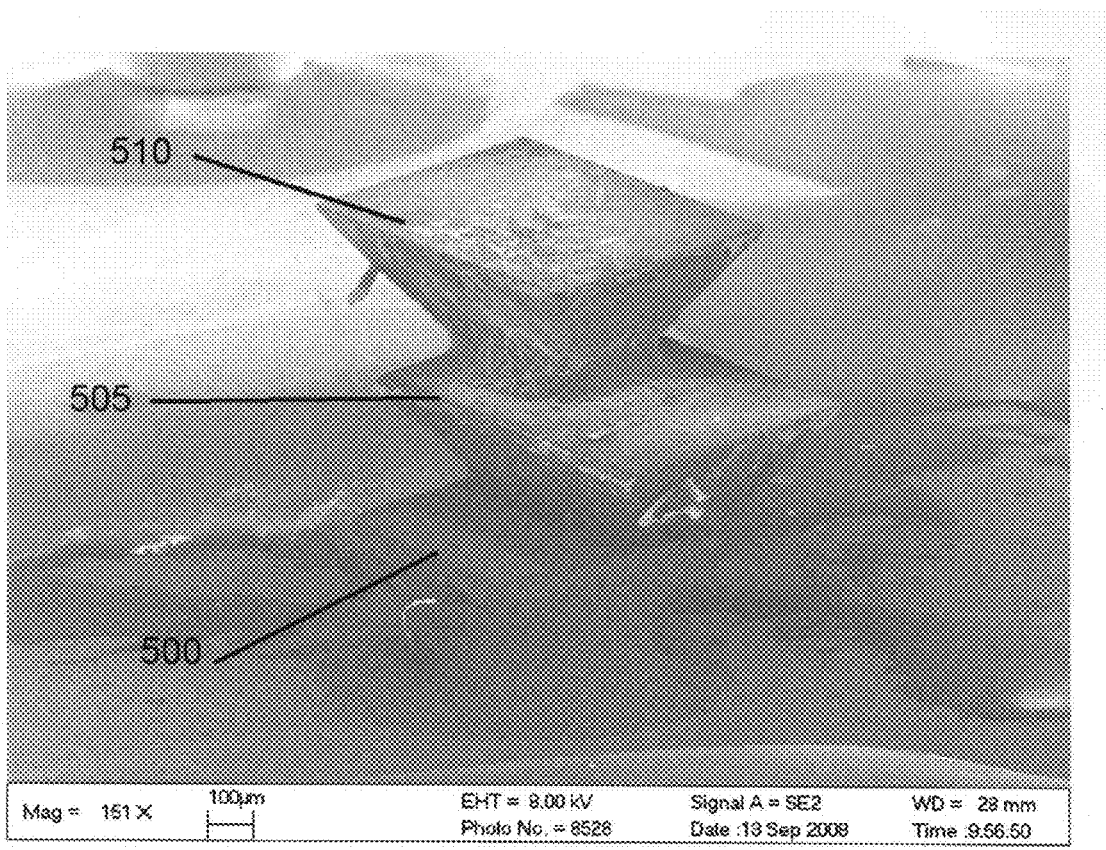
FIG. 5 shows a scanning electronic microscope (SEM) image of an assembled three-LED stack according to the present invention.

FIG. 5 shows a scanning electronic microscope (SEM) image of an assembled three-LED stack according to the present invention. As shown, the three-LED stack may include a first LED device 500 which is disposed beneath both a second LED device 505, and a third LED device 510.

Figure 6:
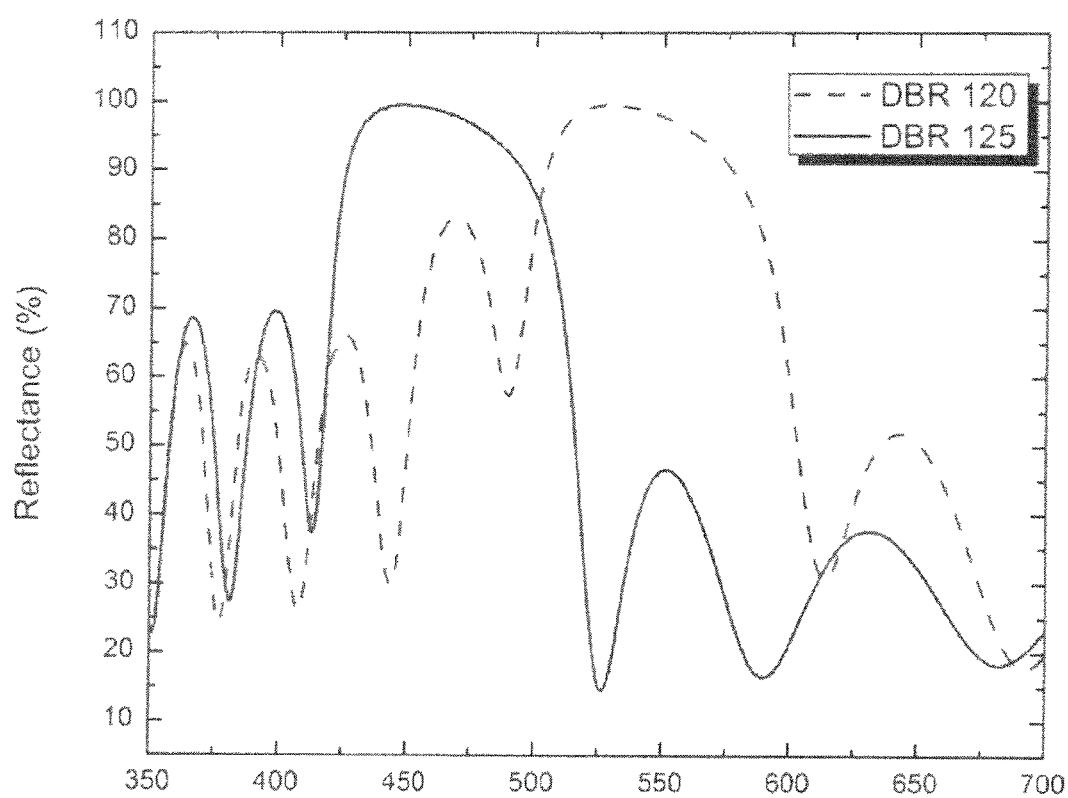
FIG. 6 shows reflectance spectra of layers of a first distributed Bragg reflector (DBR) layer and a second DBR layer according to the present invention.

FIG. 6 shows reflectance spectra of layers of a first DBR layer (e.g., DBR 120 of FIG. 1) and a second DBR layer (e.g., DBR 125 of FIG. 1) according to the present invention. As shown, a reflectance spectra for DBR 120 has a peak located near 550 nm and a reflectance spectra for DBR 125 has a peak located near 470 nm.

Figure 7:
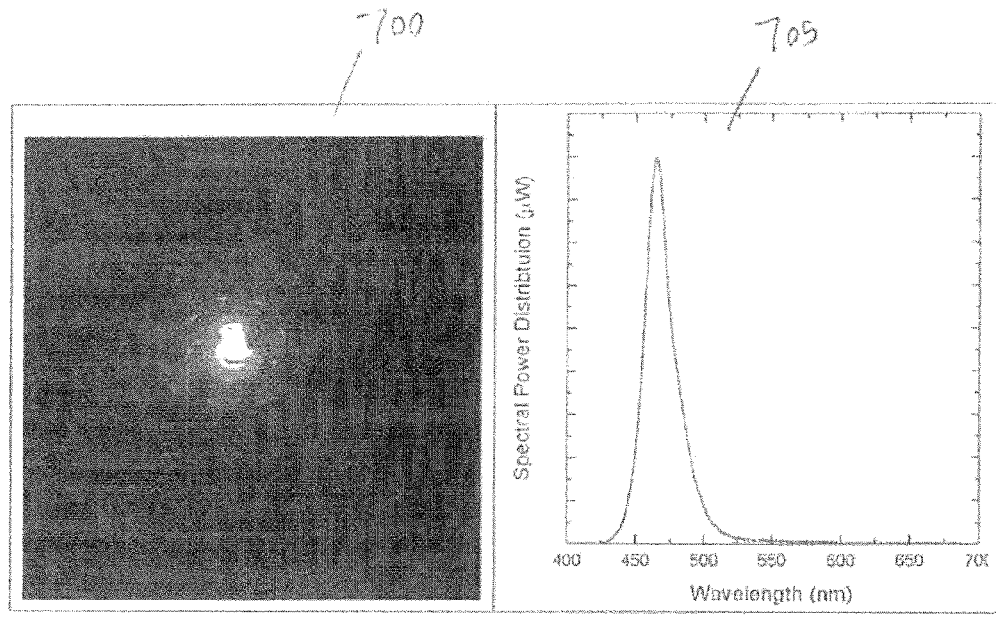
FIG. 7 shows monochromatic blue light emission from an LED stack, and the corresponding spectrum according to the present invention.

FIG. 7 shows monochromatic blue light emission 700 from an LED stack, and the corresponding spectrum 705 according to the present invention. As shown, the spectrum as a peak power distribution located around 475 nm.

Figure 8:
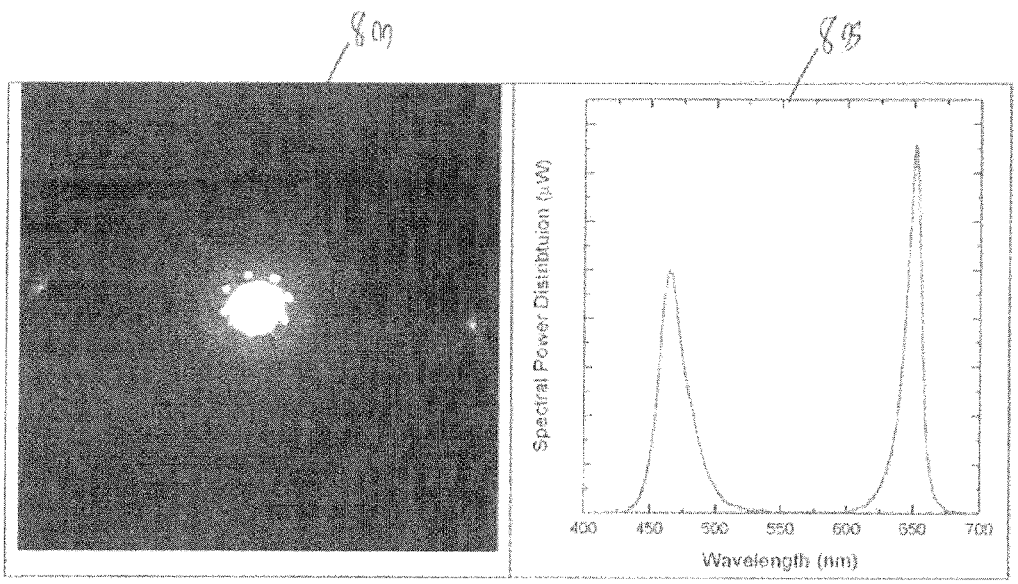
FIG. 8 shows polychromatic pink light emission from an LED stack by mixing blue and red emission, together with the corresponding spectrum according to the present invention.

FIG. 8 shows polychromatic pink light emission 800 from an LED stack by mixing blue and red emission, together with the correspond spectrum 805 according to the present invention. As shown, the spectrum has peak power distributions located around 475 nm and 650 nm.

Figure 9:
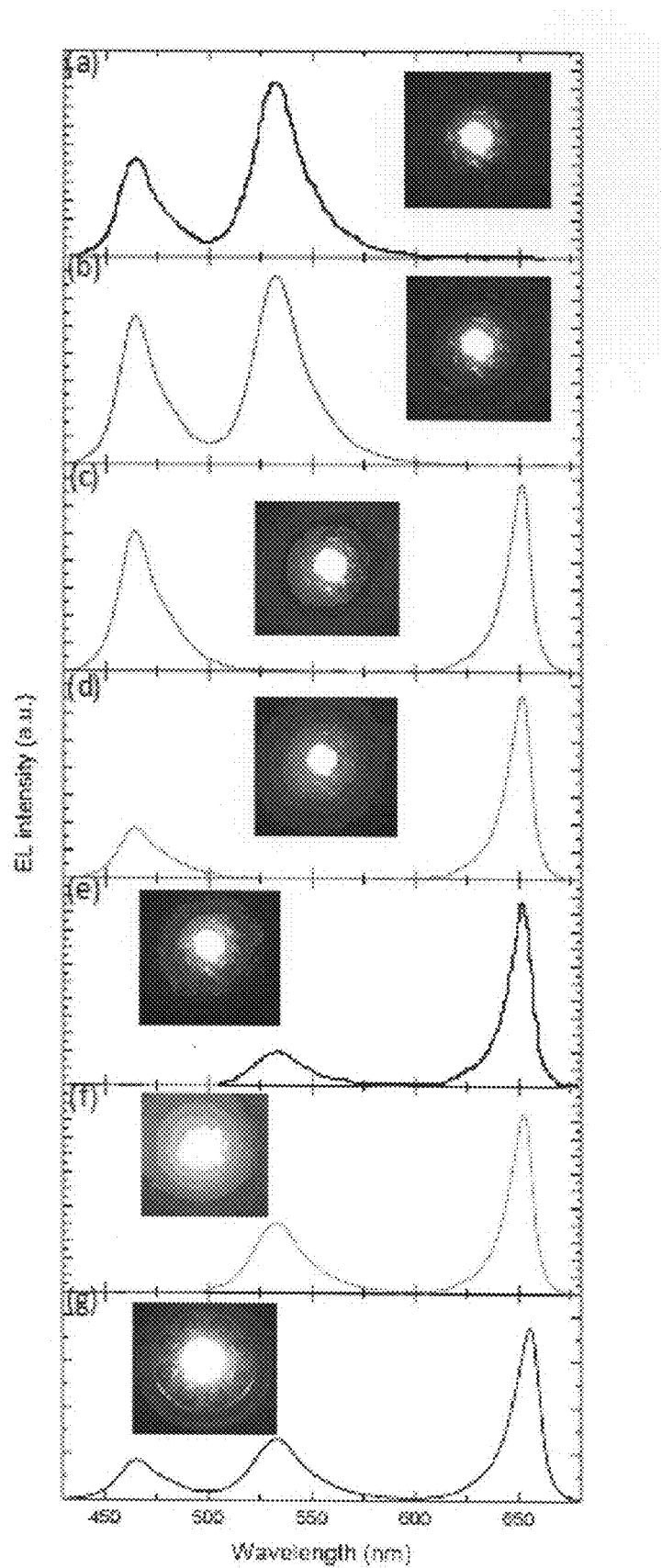
FIG. 9 shows a range of different colors emitted by an LED stack, together with its corresponding spectra according to the present invention.

FIG. 9 shows a range of different colors emitted by an LED stack, together with its corresponding spectra according to the present invention. As shown, various different colors of light may be emitted, and the different colors may be comprised of various peak power distributions. Various colors are emitted including, turquoise in example (a), navy blue in example (b), dark purple in example (c), light purple in example (d), yellow in example (e), maroon in example (f), and black in example (g).

Figure 10:
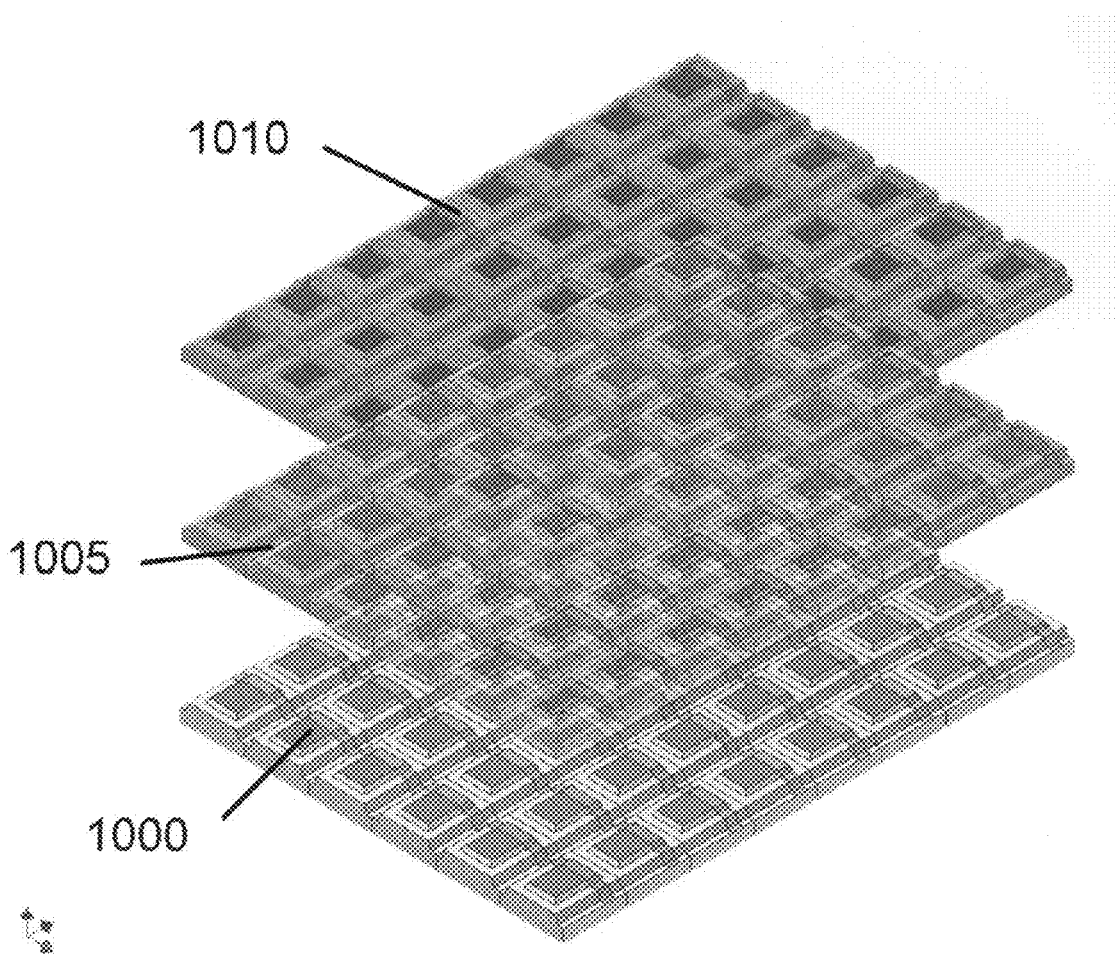
FIG. 10 shows a schematic diagram of the three red, green and blue microdisplays according to the present invention.

FIG. 10 shows a schematic diagram of the three red, green and blue microdisplays according to the present invention. As illustrated, a red microdisplay 1000 may be disposed below a green microdisplay 1005, which may in turn be disposed below a blue microdisplay 1010.

Figure 11:
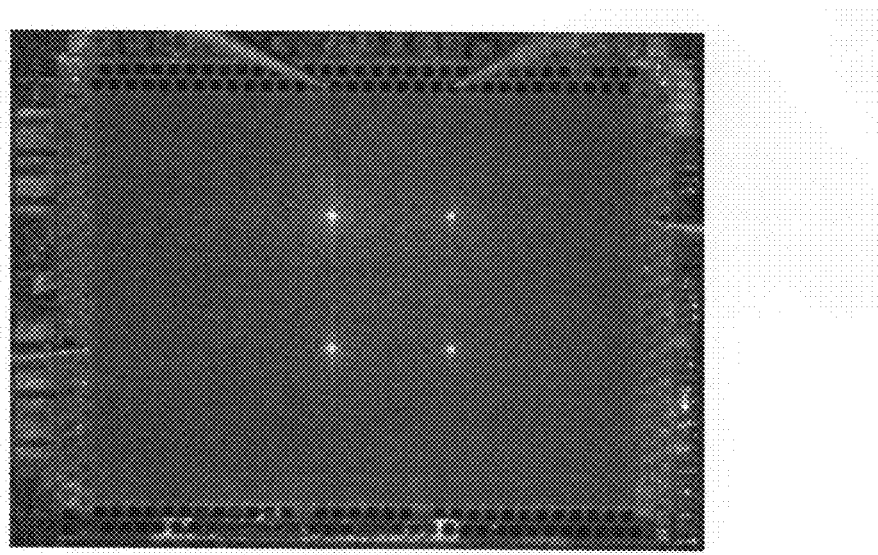
FIG. 11 shows a microphotograph of a fabricated blue monochromatic microdisplay according to the present invention.
Figure 12:
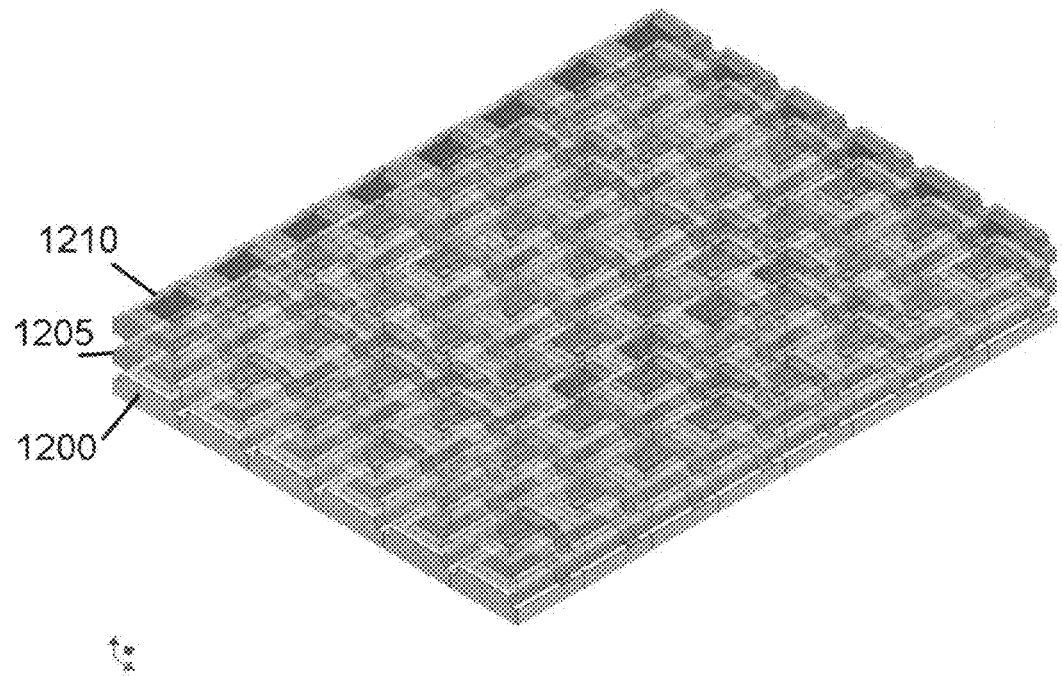
FIG. 12 shows an orthogonal view schematic diagram of an assembled stacked microdisplay according to the present invention.
Figure 13:
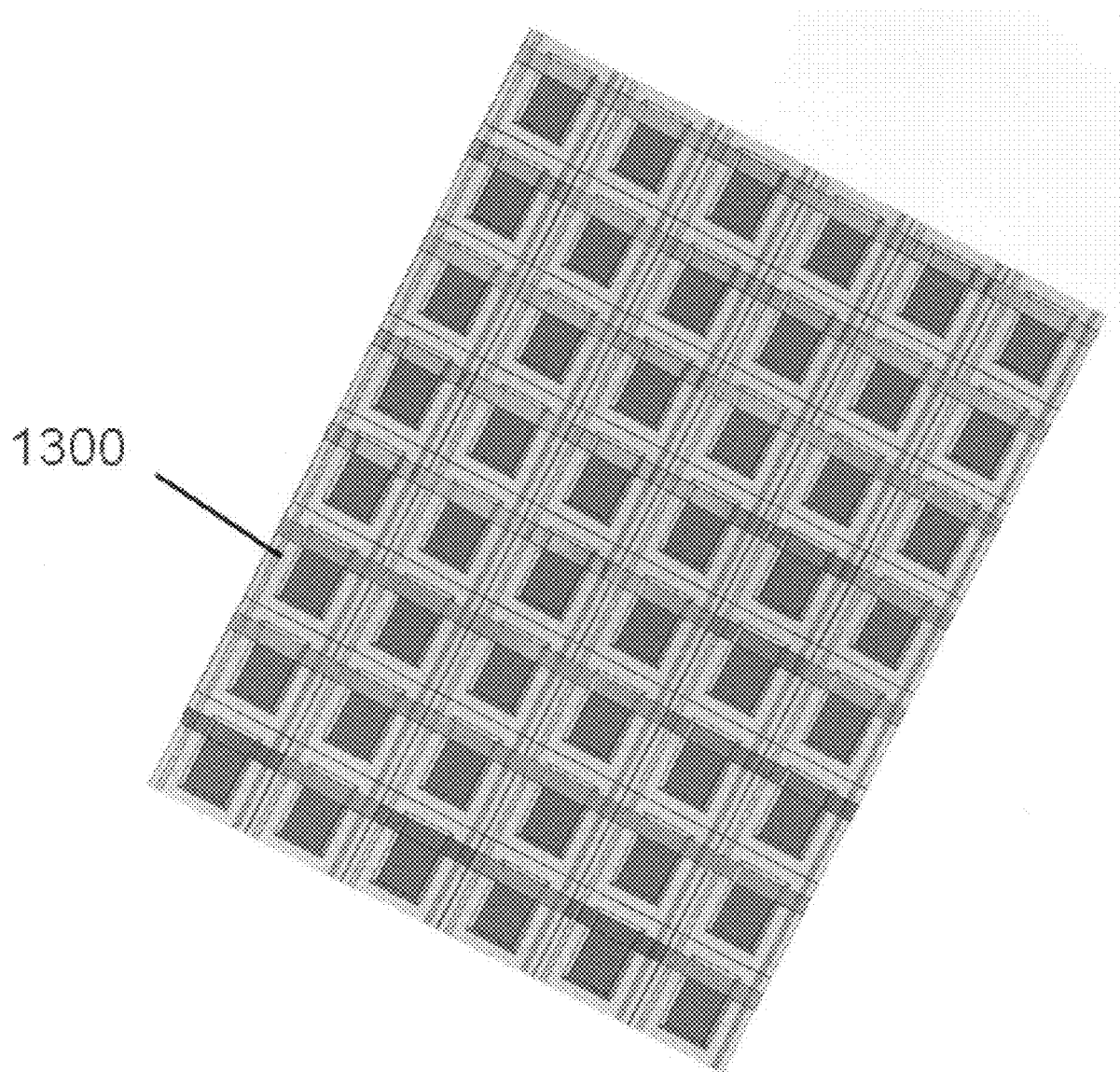
FIG. 13 shows the top view schematic diagram of an assembled stacked microdisplay according to the present invention.

FIG. 11 shows a microphotograph 1100 of a fabricated blue monochromatic microdisplay according to the present invention. FIG. 12 shows an orthogonal view schematic diagram of an assembled stacked microdisplay according to the present invention. As illustrated, a red microdisplay 1200 may be disposed below a green microdisplay 1205, which may in turn be disposed below a blue microdisplay 1210. FIG. 13 shows the top view schematic diagram of an assembled stacked microdisplay 1300 according to the present invention.

An implementation of a device containing stack LEDs, as discussed herein, may eliminate or substantially reduce disadvantages associated with conventional phosphor-coated white LEDs, tapping the full potential of the LEDs to realize solid state lighting. First, eliminating the need for color conversion agents such as phosphors translates to lossless white light generation. Second, the lifetime of a conventional white light LED is limited by the lifetime of color conversion agents, such as phosphors. However, by avoiding use of phosphors, the lifetime of a white LED is simply the lifetime of the individual LEDs in the LED stack, which are well-known to have prolonged lifetimes and are extremely reliable.

Third, all other drawbacks associated with color conversion agents, such as limited lifetime, Stokes-wave energy loss, low reliability and low luminous efficiency may be eliminated. Fourth, the issue of light absorption by underlying devices is resolved by the insertion of a distributed Bragg reflector (DBR) (e.g., DBR 120 and 125 of FIG. 1) between two LEDs which reflects light from the upper LED, yet allows light from the lower LED to be transmitted. Fifth, the issue of potential light leakage from device facets, which would otherwise affect emission homogeneity, is resolved through the introduction of mirror-coated angled facets, so that light propagating laterally will be reflected and redirected for emission from the top surface of the device. Finally, the stacking topography ensures optical color mixing, offering uniform polychromatic light emission.

Green, blue and red LEDs may be fabricated using a standard LED processing sequence, involving photolithography, dry etching and metal deposition. Green and blue LEDs may be fabricated using an LED wafer, with InGaN material grown epitaxially by MOCVD on a transparent sapphire substrate. A series of multi-quantum wells are embedded in the LED structure to achieve the desired emission wavelength (by tailoring the bandgap). A red LED may be fabricated using an LED wafer, with AlInGaP material grown epitaxially by MOCVD on non-transparent GaAs substrate.

A green or blue LED may fabricated by first defining the mesa region of an LED using photolithography. A layer of photoresist is spin-coated onto an LED wafer, and may be exposed to ultraviolet light through a photo mask with the pre-defined pattern on a mask-aligner. The exposed sample may be developed in a photoresist developer. The required pattern is transferred onto the sample. A mesa structure may be subsequently formed using inductively-coupled plasma (ICP) dry etching with $Cl_2$ and $BCl_3$ gases. GaN material is subsequently etched away at a typical rate of 500 nm/min.

Another photolithography step may define an active region of an LED. A wafer may be dry etched again using the same ICP recipe, exposing a portion of the n-type GaN region for subsequent n-contact. The current spreading region may be defined by photolithography. A current spreading layer comprising 5 nm of Au and 5 nm of Ni is deposited by electron beam evaporation. A metal layer may then be lifted off in acetone, so that a metal bi-layer remains in a current spreading region. This layer may act as a p-type contact to the device.

The n-type and p-type contact pad regions may be defined by photolithography. A Ti/Al metal bi-layer with thicknesses of 20/200 nm respectively may be deposited by electron beam evaporation. A metal layer may be lifted off in acetone, so that metal only remains in a contact pad regions, acting as n- and p-type contact pads. A sapphire face of the wafer may be thinned down to about 100 microns to improve heat dissipation, and polished to enhance light transmission through a sapphire substrate.

A red LED is fabricated by depositing Au p-type contacts on the top LED surface and Au n-type contacts on the bottom GaAs surface. Unlike a GaN-based LED, vertical current conduction is possible since GaAs is an electrical conductor.

A DBR may be grown on top of LED wafers if needed. A DBR may comprise a wavelength-selective mirror which may reflect light of certain wavelengths within a reflectance band and transmit light of other wavelengths within the transmission band, comprising pairs of alternate dielectric materials with a refractive index difference. The characteristics of the DBR depend on the design parameters, including choice of dielectric materials and their thicknesses.

In the case of a red-green-blue ("RGB") stack, DBR layers may be grown on top of a green LED wafer and red LED wafer. A DBR on top of the green LED may reflect blue light from a blue LED on top, while allowing green light and red light from green and red LEDs respectively to pass through. A DBR on top of the red LED may reflect green light from the green LED on top, while allowing red light from the red LED to pass through.

Wafers may be diced using a customized laser micromachining system. Individual LED chips with angled facets of desired dimensions may be obtained.

Figure 14:
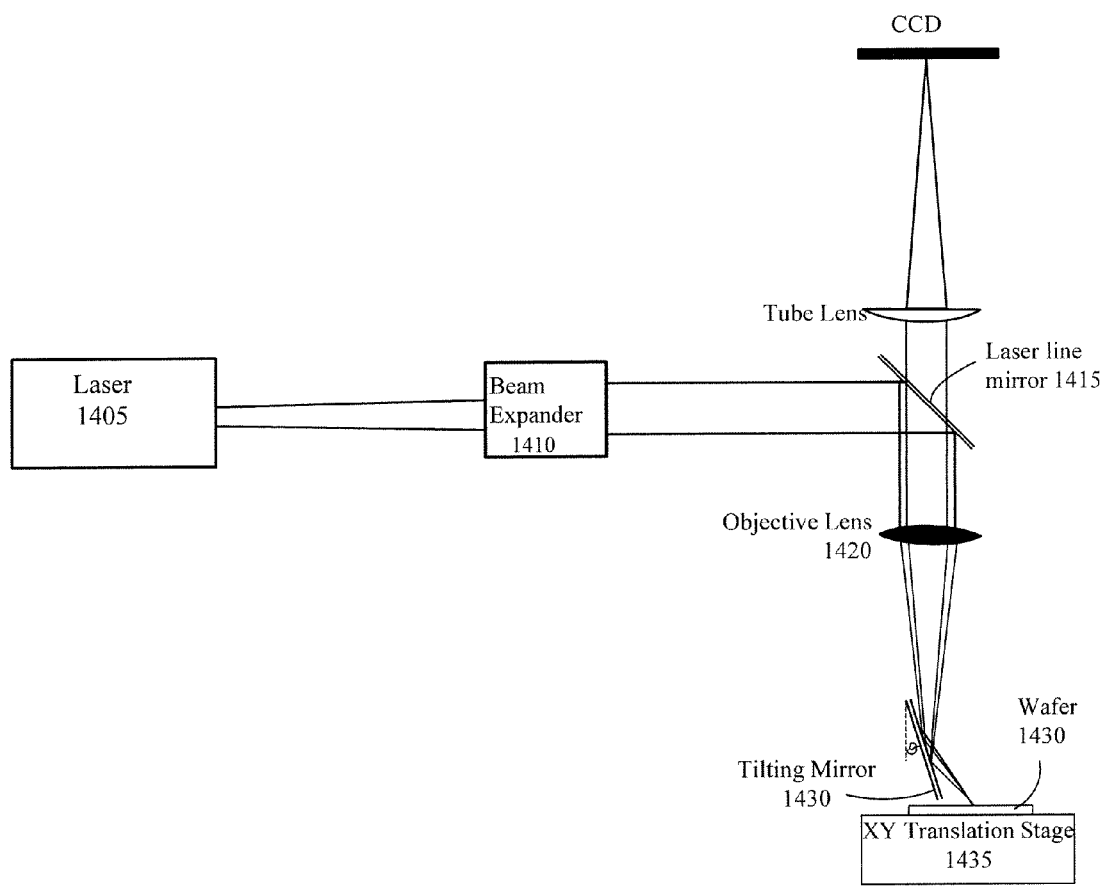
FIG. 14 illustrates a laser micromachining system that may include several major components, including a high power ultraviolet (UV) laser, beam expander, laser line mirror, focusing lens, broadband UV mirror, a wafer, and an X-Y-Z translation system according to the present invention.

FIG. 14 illustrates a laser micromachining system 1400 that may include several major components, including a high power ultraviolet (UV) laser 1405, beam expander 1410, laser line mirror 1415, focusing UV objective lens 1420, broadband UV tilting mirror 1425, a wafer 1430, and an X-Y translation stage 1435. Wafer 1430 may be moved by X-Y translation stage 1435 while a focused laser beam is shined onto wafer 1430.

In conventional laser micromachining, a focusing lens focuses a laser beam to a small spot, which is incident onto a wafer to be micromachined vertically. However, according to an implementation herein, a broadband UV mirror is inserted between a focusing lens and a wafer. The mirror is placed at an oblique angle, the purpose of which is to reflect the beam off the minor so that the focused beam can be incident onto the wafer at any arbitrary oblique angle. The angle can be adjusted by turning the mirror. As a result, the diced device chips may have angled facets with any arbitrary oblique angles.

Assembly of an LED stack may begin with chip-binding a red LED to a TO-can package using a thermally-conducting and electrically-conducting silver epoxy. A green LED is mounted on top of the red LED by applying a layer of UV adhesive (e.g., Norland 63), while exposing the top p-type bonding pad of the red LED. Once the devices are aligned the assembly may be cured under UV irradiation.

A blue LED may then mounted on top of the assembly, ensuring the bonding pads of the devices underneath are exposed. Again, UV adhesive may be used between the LED chips. An LED stack may be fixed in position by exposure under UV radiation.

An LED stack may be inverted and a metal mirror, typically using Aluminum or Silver, is coated by electron beam evaporation of sputtering. The metal mirror will be coated onto angled facets of chips in a stack. Such a mirror may prevent light propagation through the facets.

Light emission from all three chips may be emitted through the top blue LED. This is possible because the top blue LED may be transparent to green and red light. This follows the rule of light absorption. Downward light emission, that is, light propagation towards the LEDs below may be inhibited due to the presence of DBR layers. As a result, optical loss is minimized. Light emission from the side facets is also inhibited by virtue of the mirror coated angled facets, which serve to reflect laterally propagating light upwards.

Five wire-bonds may be required to establish electrical connection to the chips, including the p-pad of the red LED and the p and n-pads of the green and blue LEDs. The n-pad of the red LED may be connected using the electrically conducting silver adhesive. Such n-pads may be interconnected to form a common anode. Finally, a 4-terminal device is achieved that includes one common anode and three cathodes for the red, green and blue LEDs respectively.

By applying a bias voltage to a single cathode, a single device is turned on and the overall stack emits monochromatic light. Polychromatic light may be emitted by applying a bias voltage to more than one cathode. Emission color may be tuned by adjusting the respective cathodes. By adjusting the right components (e.g. respective intensity and amount) of red, green and blue colors, white light emission can be achieved.

This may be a lossless method of white light generation, involving addition (summing up) of spectral components from overlapping monochromatic devices.

Monochromatic emissive micro-light emitting diode two-dimensional arrays may be stacked to form full color two-dimensional microdisplays. Monochromatic 2-D microdisplays may be fabricated using blue, green and red LED wafers. The LED arrays may be monolithic LED arrays.

Design of an x by y array may be based on a matrix-addressing scheme. The array may include x columns forming the basis of array, with y number of micro-LED elements (of micrometer dimensions) evenly distributed along each column.

Hence, devices on a column share a common n-type region, and thus a common n-type electrode. P-type regions at the top of each micro-LED may be interconnected by metal lines which run across the columns. A total number of contact pads is thus (x+y), much less than if each pixel were to have its individual electrodes (x*y).

Columns and micro-LED pixels are formed by inductively coupled plasma (ICE) etching. The processing conditions are tuned to etch mesa structures with sidewalls that have an inclination to the vertical of 30° to 45°. A 40 nm $SiO_2$ layer may be deposited by electron beam evaporation for the isolation of the n and p-doped regions.

A top planar surface of each individual pixel may be subsequently exposed for contact formation using a lift-off process. Ti/Al (20/200 nm) and Ni/Au(30/30 nm) may be deposited as n- and p-type ohmic contacts by lift-off using electron beam evaporation. Contacts may be subjected to rapid thermal annealing (RTA) 550° C. for 5 min in a nitrogen ambient. Such metal interconnects may cover the sidewalls of micro-LED pixels to ensure that light is emitted only through the top surface.

A full color microdisplay may be assembled by stacking a blue microdisplay on top of a green microdisplay, followed by stacking on top of a red LED display. Red, green and blue microdisplays may be designed such that their pixels can be aligned, but their bonding pads are at different positions.

A red microdisplay may be chip-bonded to a suitable ceramic package. A green microdisplay may be mounted on top of the red microdisplay by applying a layer of UV adhesive (Norland 63), while exposing the bonding pads of the red microdisplay. Once the individual pixels are aligned, the assembly may be cured under UV irradiation.

A blue microdisplay may be mounted on top of the assembly, ensuring the bonding pads of the devices underneath can be exposed. Again, UV adhesive may be used between the LED chips.

An LED stack may be fixed in position by exposure under UV radiation. Bond pads may be connected to the package by wire bonding. The overall device may be connected to a suitable external matrix driver for operation. Pixels may be controlled to emit any color in the visible spectrum.

Figure 15:
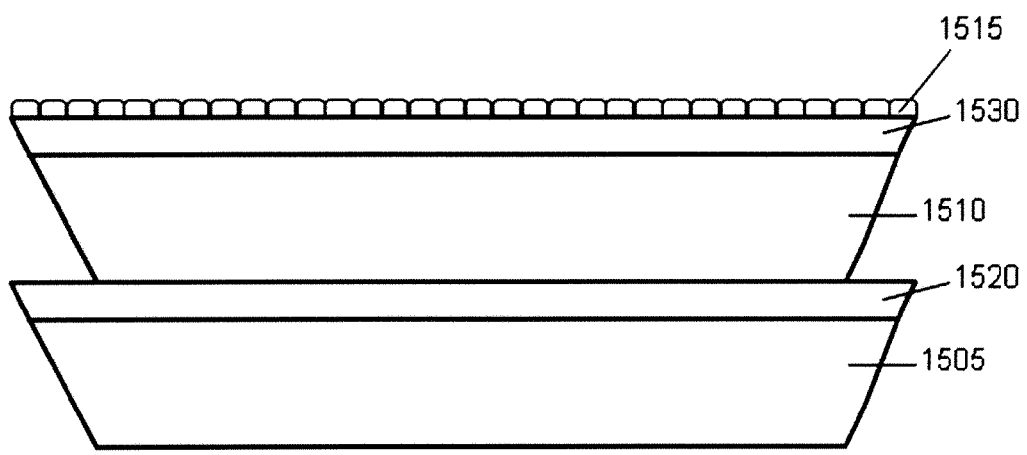
FIG. 15 illustrates an LED stack according to the present invention.

FIG. 15 illustrates an LED stack according to another embodiment. Referring to FIG. 15, light emits through stacked devices for uniformity. Similarly to the three LED device stacked LED design discussed above, a red LED 1505 is formed on the bottom and a blue LED 1510 is stacked at the top. For the embodiment as provided in FIG. 15, the middle green LED device is omitted. Instead, the generation of green light is accomplished by using green fluorescent microspheres 1515 disposed on the blue LED 1510. In another embodiment, phosphors or quantum dots can be used to provide the excitable green wavelengths. With two stacked LEDs instead of three stacked LEDS, the assembly is easier and heat dissipation can be improved. In addition, the number of top wire-bonds can be reduced from 5 top wire-bonds to 3 top wire bonds. Accordingly, the hybrid device can be easier to assemble, has better heat-sinking capability, and may be easier to package due to the reduction in top wire-bonds. Some energy loss may occur, but the blue LED below the green fluorescent microspheres can efficiently excite green fluorescence, minimizing energy loss.

An implementation may also extend to full color microdisplays using a similar strategy. For example, two monochromatic microdisplays may be stacked well-aligned on top of each other with dyed fluorescent microspheres disposed on the top microdisplay. A blue microdisplay may be stacked on top of a red microdisplay, and green fluorescent microspheres can be provided on the blue microdisplay. The green fluorescent microspheres may be provided on the blue microdisplay before stacking the blue microdisplay on top of the red microdisplay. The two microdisplays may have identical design and dimensions, so that if stacked together the individual pixels overlap each other.

According to one implementation, a red LED and a blue LED may be fabricated using any suitable processing. A DBR may also be grown on the top surface of the LED wafers. In one implementation, the DBR 1520 is grown on the top surface of the red LED 1505 to reflect blue light from the blue LED 1510 on top, while allowing red light from the red LED 1505 to pass through. In another implementation, the DBR 1530 is also grown on the top surface of the blue LED 1510 to reflect green light from the green fluorescent microspheres.

Assembly of the hybrid LED stack may begin by mounting a blue LED on a selected red LED using, for example, a layer of UV adhesive while exposing a top p-type bonding pad of the red LED. For implementations where the LEDs include angled facets, the red LED/blue LED stack can be inverted and a metal mirror can be coated onto the angled facets of the chips in the stack. The green fluorescent microspheres can be uniformly coated on the top surface of the blue LED.

Example fluorescent microspheres that may be utilized can include microspheres available by Duke Scientific Corporation and Merck Estapor. These fluorescent microspheres are typically suspended in deionized (DI) water; and their dimensions range from tens of nanometers to tens of microns in diameter. The microspheres can be provided having a spherical shape and dimensional uniformity.

To uniformly coat the microspheres onto the surface of the blue LED, the suspension of microspheres is dispensed onto the blue LED using a dropper, syringe or pipette.

The microspheres may be spread uniformly over the blue LED by spin-coating using a spinner. Rotation speeds of 1-5 rpm may be used for this process. The microspheres may also be spread out by tilting. For example, after applying the microsphere suspension onto the LED chip, the device is tilted to an angle of about 45 degrees to the vertical.

The thickness of the microsphere layer can be controlled to several monolayers. This is due to the larger dimensions (hundreds of nanometers to microns in diameters) of fluorescent microspheres as compared to phosphors. By achieving a thin microsphere coating (e.g., no more than a few monolayers), the microspheres organize themselves into a hexagonal array. This becomes a self-assembled ordered array of nanoparticles.

The fluorescent microspheres can be fixed in place and protected by coating a dielectric layer, such as $SiO_2$, using electron beam evaporation. An epoxy-type encapsulant may be further applied over the microsphere-coated chip to protect the hybrid LED stack from the external environment.

Another method of microsphere coating is to pre-mix the microspheres with the encapsulant. The microsphere suspension is placed into a test-tube and heated to remove the water content (DI water). Encapsulant is added into the test-tube. The test-tube is placed onto a shaker for uniform mixing. The mixture can then be applied to the LED stack using a dropper, syringe or pipette.

In one aspect, differently-dyed microspheres with differing emission wavelengths can be mixed in varying proportions to achieve white light with different degrees of "whiteness." that is, different color temperatures.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

What is claimed is:

1. A light sources apparatus, comprising:
    a first light emitting diode for emitting light having a first wavelength, the first light emitting diode comprising angled facets to reflect incident light in a direction toward a top end of the first light emitting diode;
    a second light emitting diode for emitting light having a second wavelength, the second light emitting diode being disposed above the top end of the first light emitting diode, and the second light emitting diode comprising angled facets to reflect incident light in a direction toward a top end of the second light emitting diode; and
    a first distributed Bragg reflector disposed between the top end of the first light emitting diode and a bottom end of the second light emitting diode to allow light from the first light emitting diode to pass through and to reflect light from the second light emitting diode.

2. The light sources apparatus of claim 1, wherein at least one of the first light emitting diode and second light emitting diode is substantially monolithic.

3. The light sources apparatus of claim 1, wherein the first wavelength is longer than the second wavelength.

4. The light sources apparatus of claim 1, further comprising a third light emitting diode for emitting light having a third wavelength, the third light emitting diode being disposed above a top end of the second light emitting diode, and the third light emitting diode comprising angled facets to reflect incident light in a direct toward a top end of the third light emitting diode.

5. The light sources apparatus of claim 1, further comprising a layer of fluorescent microspheres on the second light emitting diode that emits light having a third wavelength when excited by light from the first light emitting diode or the second light emitting diode.

6. The light sources apparatus of claim 4, further comprising a second distributed Bragg reflector disposed between the top end of the second light emitting diode and a bottom end of the third light emitting diode to allow light from the second light emitting diode to pass through and to reflect light from the third light emitting diode.

7. The light sources apparatus of claim 4, wherein the first, second, and third light emitting diodes have a substantially identical design and emission area, the first, second, and third light emitting diodes being fabricated on different semiconductor materials with different bandgaps.

8. The light sources apparatus of claim 4, wherein light emitted from the first light emitting diode passes through the second and third light emitting diodes substantially without loss due to respective bandgaps.

9. The light sources apparatus of claim 4, wherein the first light emitting diode emits red light, the second light emitting diode emits green light, and the third light emitting diode emits blue light.

10. The light sources apparatus of claim 4, further comprising a mirror coating on the angled facets of individual LEDs, the mirror coating comprising a layer of metal and adapted to reflect light and suppress leakage of light from the angled facets of the first, second, and third light emitting diode.

11. The light sources apparatus of claim 9, wherein the light sources apparatus emits red light in response to turning on only the first light emitting diode, green light in response to turning on only the second light emitting diode, and blue light in response to turning on only the third light emitting diode.

12. The light sources apparatus of claim 9, wherein the light sources apparatus simultaneously emits red light from the first light emitting diode, green light from the second light emitting diode, and blue light from the third light emitting diode, to generate polychromatic light.

13. The light sources apparatus of claim 12, wherein the polychromatic light comprises white light.

14. The light sources apparatus of claim 13, wherein the white light is produced without color conversion.

15. The light sources apparatus of claim 12, wherein an optical output of the light sources apparatus is tunable by varying intensity or amount of the red light, blue light, and green light.

16. The light sources apparatus of claim 5, wherein the first light emitting diode emits red light, the second light emitting diode emits blue light, and the layer of fluorescent microspheres emits green light.

17. The light sources apparatus of claim 16, wherein the light sources apparatus simultaneously emits red light from the first light emitting diode and blue light from the second light emitting diode to generate polychromatic light through the layer of fluorescent microspheres.

18. An optoelectronic device comprising a stack of monochromatic microdisplays, the stack of monochromatic microdisplays comprising:
    a first microdisplay to emit light having a first wavelength;
    at least a second microdisplay to emit light having a second wavelength, the first wavelength being different from the second wavelength; and
    a distributed Bragg reflector disposed between the first microdisplay and the at least a second microdisplay to allow light from the first microdisplay to pass through and to reflect light from the at least a second microdisplay.

19. The optoelectronic device of claim 18, wherein the first microdisplay and the at least the second microdisplay comprise a green microdisplay stacked on top of a red microdisplay and a blue microdisplay stacked on top of the green microdisplay.

20. The optoelectronic device according to claim 18, wherein the second microdisplay is stacked on the first microdisplay, the optoelectronic device further comprising at least one layer of fluorescent microspheres on top of the second microdisplay.

21. The optoelectronic device of claim 19, wherein the green, blue, and red microdisplays have a substantially identical design and dimensions.

22. The optoelectronic device of claim 21, wherein the green, blue, and red microdisplays are fabricated on different semiconductor materials with bandgaps corresponding to the color being emitted.

23. The optoelectronic device of claim 19, wherein each individual monochromatic microdisplay comprises at least one pixel, the pixel comprising a two-dimensional array of matrix-addressable micro-meter scale light-emitting diodes.

24. The optoelectronic device according to claim 23, wherein an individual pixel on each of the red, green, and blue microdisplays is stacked on top of each other to form a pixel stack.

25. The optoelectronic device according to claim 24, wherein components in the pixel stack are individually controllable to achieve different emission intensities.

26. The optoelectronic device according to claim 24, wherein the emission from light emitting diodes in a pixel stack is optically mixed.

27. The optoelectronic device according to claim 24, wherein the pixel stack is arranged as a two-dimensional array of light emitting diode stacks, at least one of the light emitting diode stacks being color-tunable.

28. The optoelectronic device according to claim 20, wherein the first microdisplay is a red microdisplay, the second microdisplay is a blue microdisplay, and the at least one layer of fluorescent microspheres comprises green fluorescent microspheres.

29. A wafer dicing process of electronic and optoelectronic devices based on laser micromachining to form diced chips with angled facets, the wafer dicing process comprising:
  providing a processed wafer with multiple fabricated devices on an upper surface;
  directing a laser beam at the wafer surface for wafer dicing;
  reflecting the laser beam off a laser mirror, wherein the laser beam is incident onto the processed wafer at an oblique angle from a vertical axis, the incident beam forming a trench at a point of incidence by removal of semiconductor, metal or insulator materials;
  translating the processed wafer so that the laser beam forms a trench around a periphery of devices on the processed wafer.

30. The wafer dicing process of claim 29, wherein the oblique angle ranges from about 0 degrees to about 89 degrees from the vertical axis.

31. The wafer dicing process of claim 29, wherein the processed wafer is ready for cleaving due to a presence of laser micromachined scribe lanes on the processed wafer.

32. The wafer dicing process of claim 29, further comprising removing the semiconductor, metal, or insulator materials from the processed wafer via at least one of: ablation or absorption.

* * * * *